(12) United States Patent
Xu et al.

(10) Patent No.: US 11,309,997 B2
(45) Date of Patent: *Apr. 19, 2022

(54) GENERATION OF POLAR CODES WITH A VARIABLE BLOCK LENGTH UTILIZING PUNCTURING

(71) Applicant: QUALCOMM Incorporated, San Diego, CA (US)

(72) Inventors: Changlong Xu, Beijing (CN); Jian Li, Beijing (CN); Jilei Hou, San Diego, CA (US); Neng Wang, Lund (SE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/874,264

(22) Filed: May 14, 2020

(65) Prior Publication Data

US 2020/0274644 A1 Aug. 27, 2020

Related U.S. Application Data

(63) Continuation of application No. 16/065,077, filed as application No. PCT/CN2016/095661 on Aug. 17, (Continued)

(51) Int. Cl.
*H04L 1/00* (2006.01)
*H03M 13/00* (2006.01)
*H03M 13/13* (2006.01)

(52) U.S. Cl.
CPC .......... *H04L 1/0068* (2013.01); *H03M 13/13* (2013.01); *H03M 13/618* (2013.01); (Continued)

(58) Field of Classification Search
CPC ... H04L 1/0068; H04L 1/0054; H04L 1/0057; H03M 13/13; H03M 13/618; H03M 13/6362
(Continued)

(56) References Cited

U.S. PATENT DOCUMENTS 7,596,354 B2 9/2009 Schiff
10,177,787 B1 * 1/2019 Danjean ............. H03M 13/1142
(Continued)

FOREIGN PATENT DOCUMENTS

CN 102122966 A 7/2011
CN 103023618 A 4/2013
(Continued)

OTHER PUBLICATIONS

Wang et al., A Novel Puncturing Scheme for Polar Codes, Dec. 2014, IEEE, vol. 18, No. 12, pp. 2081-2084. (Year: 2014).*
(Continued)

*Primary Examiner* — John J Tabone, Jr.
(74) *Attorney, Agent, or Firm* — Loza & Loza LLP

(57) ABSTRACT

Polar codes may be generated with a variable block length utilizing puncturing. Some puncturing schemes consider punctured bits as unknown bits, and set the log likelihood ratio (LLR) for those bits to zero; while other puncturing schemes consider punctured bits as known bits, and set the LLR for those bits to infinity. Each of these puncturing schemes has been observed to provide benefits over the other under different circumstances, especially corresponding to different coding rates or different signal to noise ratio (SNR). According to aspects of the present disclosure, both puncturing schemes are compared, and the puncturing scheme resulting in the better performance is utilized for transmission.

35 Claims, 13 Drawing Sheets

Related U.S. Application Data 2016, now Pat. No. 10,749,633, which is a continuation of application No. PCT/CN2016/071959, filed on Jan. 25, 2016.

(52) U.S. Cl.
CPC ...... *H03M 13/6362* (2013.01); *H04L 1/0054* (2013.01); *H04L 1/0057* (2013.01)

(58) Field of Classification Search
USPC .................................................. 714/790, 794
See application file for complete search history.

(56) References Cited

U.S. PATENT DOCUMENTS

| | | | |
|---|---|---|---|
| 10,389,390 B2* | 8/2019 | Myung | H03M 13/1102 |
| 2005/0283708 A1* | 12/2005 | Kyung | H03M 13/6393 714/758 |
| 2009/0175387 A1 | 7/2009 | Park et al. | |
| 2013/0061114 A1 | 3/2013 | Malmirchegini et al. | |
| 2013/0343271 A1 | 12/2013 | El-Khamy et al. | |
| 2015/0077277 A1* | 3/2015 | Alhussien | H04L 1/0057 341/67 |
| 2015/0236715 A1 | 8/2015 | Alhussien et al. | |
| 2016/0248442 A1* | 8/2016 | Myung | H03M 13/2778 |
| 2016/0261280 A1* | 9/2016 | Jeong | H03M 13/1165 |
| 2016/0261282 A1* | 9/2016 | Myung | H04L 1/0057 |
| 2016/0261369 A1* | 9/2016 | Jeong | H04L 1/0041 |
| 2016/0261370 A1* | 9/2016 | Jeong | H03M 13/6362 |
| 2018/0375615 A1 | 12/2018 | Xu et al. | |

FOREIGN PATENT DOCUMENTS

| | | |
|---|---|---|
| CN | 103281166 A | 9/2013 |
| CN | 103414540 A | 11/2013 |
| CN | 103746708 A | 4/2014 |
| CN | 103778958 A | 5/2014 |
| CN | 103873073 A | 6/2014 |
| CN | 103888151 A | 6/2014 |
| CN | 105075163 A | 11/2015 |
| EP | 2802080 A1 | 11/2014 |
| WO | 2007111734 A2 | 10/2007 |
| WO | 2015062107 A1 | 5/2015 |

OTHER PUBLICATIONS

Chen et al., "A Hybrid ARQ Scheme Based on Polar Codes", Oct. 2013, IEEE, vol. 17, No. 10, pp. 1996-1999.

International Search Report and Written Opinion—PCT/CN2016/071959—ISA/EPO—dated Oct. 10, 2016.

International Search Report and Written Opinion—PCT/CN2016/095661—ISA/EPO—dated Nov. 7, 2016.

Mori R., et al., "Performance and Construction of Polar Codes on Symmetric Binary-Input Memoryless Channels", IEEE International Symposium on Information Theory, URL: http://www.arxiv.org/, Cornell University Library. 201, Olin Library Cornell University Ithaca, NY 14853, May 23, 2009, 5 Pages, XP080357263, DOI: 10.1109/ISIT.2009.5205857, Section III.

Niu K., et al., "Beyond Turbo Codes: Rate-Compatible Punctured Polar Codes", PROC. 2013 IEEE International Conference on Communications (ICC), IEEE, Jun. 9, 2013 (Jun. 9, 2013), pp. 3423-3427, XP032522402, ISSN: 1550-3607, DOI:10.1109/ICC.2013.6655078 [retrieved on Nov. 4, 2013].

Supplementary European Search Report—EP16887577—Search Authority—Munich—dated Jul. 16, 2019.

Trifonov P., "Efficient Design and Decoding of Polar Codes", IEEE Transactions On Communications, IEEE Service Center, Piscataway, NJ, USA, vol. 60, No. 11, Nov. 1, 2012 (Nov. 1, 2012), XP011473857, pp. 3221-3227, ISSN: 0090-6778, DOI: 10.1109/TCOMM.2012.081512.110872.

Wang R., et al., "A Novel Puncturing Scheme for Polar Codes", IEEE Communications Letters, IEEE Service Center, Piscataway, NJ, US, vol. 18, No. 12, Dec. 1, 2014 (Dec. 1, 2014), pp. 2081-2884, XP011567208, ISSN: 1089-7798, DOI: 10.1109/LCOMM.2014.2364845 [retrieved on Dec. 8, 2014].

* cited by examiner

GENERATION OF POLAR CODES WITH A VARIABLE BLOCK LENGTH UTILIZING PUNCTURING

PRIORITY CLAIM

The present Application for Patent is a Continuation of Non-Provisional application Ser. No. 16/065,077 filed in the U.S. Patent and Trademark Office on Jun. 21, 2018, the entire content of which is incorporated herein by reference as if fully set forth below in its entirety and for all applicable purposes. Non-Provisional application Ser. No. 16/065,077 is the U.S. national stage of PCT patent application number PCT/CN2016/095661 filed on Aug. 17, 2016, which is a continuation, and claims the priority and benefit, of PCT Application No. PCT/CN2016/071959 filed on Jan. 25, 2016. The disclosures of the foregoing applications are incorporated herein by reference in their entirety.

TECHNICAL FIELD

The technology discussed below relates generally to information communication systems, and more particularly, to channel coding utilizing polar codes in communication systems.

BACKGROUND

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to the noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

While research into implementation of polar codes continues to rapidly advance its capabilities and potential, additional enhancements are desired, particularly for potential deployment of future wireless communication networks beyond LTE.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a method for polar coding. The method includes selecting a selected puncturing pattern from a first puncturing pattern and a second puncturing pattern. The first puncturing pattern includes an unknown-bit puncturing scheme in which first punctured bit locations correspond to unknown bits and the second puncturing pattern includes a known-bit puncturing scheme in which second punctured bit locations correspond to known bits. The method further includes polar coding an information block to produce a polar codeword, and puncturing the polar codeword using the selected puncturing pattern to produce a punctured codeword comprising a codeword length other than a power of two.

Another aspect of the disclosure provides an apparatus configured for polar coding. The apparatus includes a processor, a memory communicatively coupled to the processor, and a transceiver communicatively coupled to the processor. The processor and the memory are configured to select a selected puncturing pattern from a first puncturing pattern and a second puncturing pattern. The first puncturing pattern includes an unknown-bit puncturing scheme in which first punctured bit locations correspond to unknown bits and the second puncturing pattern includes a known-bit puncturing scheme in which second punctured bit locations correspond to known bits. The processor and the memory are further configured to polar code an information block to produce a polar codeword, and puncture the polar codeword using the selected puncturing pattern to produce a punctured codeword comprising a codeword length other than a power of two.

Another aspect of the disclosure provides an apparatus configured for polar coding. The apparatus includes means for selecting a selected puncturing pattern from a first puncturing pattern and a second puncturing pattern. The first puncturing pattern includes an unknown-bit puncturing scheme in which first punctured bit locations correspond to unknown bits and the second puncturing pattern includes a known-bit puncturing scheme in which second punctured bit locations correspond to known bits. The apparatus further includes means for polar coding an information block to produce a polar codeword, and means for puncturing the polar codeword using the selected puncturing pattern to produce a punctured codeword comprising a codeword length other than a power of two.

Examples of additional aspects follow. In some aspects, the first puncturing pattern is a bit-reversal permutation of the second puncturing pattern. In some aspects, the final puncturing pattern is a uniform puncturing pattern. In some aspects, the polar codeword is punctured during the polar coding of the information block. In some aspects, the polar codeword includes an original codeword length of N, and the punctured codeword includes the codeword length of M. In this aspect, the method can further include setting a last N-M original bits of the information block to zero when the selected puncturing pattern is the second puncturing pattern.

In some aspects, the selected puncturing pattern is selected from the first puncturing pattern and the second puncturing pattern based on a coding rate. In some examples, the first puncturing pattern is selected as the selected puncturing pattern when the coding rate is less than a coding rate threshold and the second puncturing pattern is selected as the selected puncturing pattern when the coding rate is greater than the coding rate threshold. In some examples, the coding rate threshold is ½.

In some aspects, a first reliability of first punctured bits of the polar codeword has a first value at a decoder when using the unknown-bit puncturing scheme and a second reliability of second punctured bits of the polar codeword has a second value at the decoder when using the known-bit puncturing scheme. The second value is larger than the first value.

In some aspects, the method further includes calculating a first log likelihood ratio (LLR) sum for the unknown-bit puncturing scheme, calculating a second LLR sum for the known-bit puncturing scheme, and selecting between the unknown-bit puncturing scheme and the known-bit puncturing scheme according to a greater LLR sum between the first LLR sum and the second LLR sum. In some aspects, the polar codeword includes a plurality of coded bit locations, each corresponding to one of a plurality of sub-channels over which the polar codeword is transmitted.

In some aspects, the first LLR sum for the unknown-bit puncturing scheme is calculated by setting a respective unknown-bit LLR for each coded bit location of the plurality of coded bit locations corresponding to one of the first punctured bit locations to zero, and determining respective first coded bit LLRs for remaining ones of the plurality of coded bit locations. In some aspects, the information block includes a plurality of original bit locations and the first LLR sum for the unknown-bit puncturing scheme can be calculated by calculating respective first LLRs for the plurality of original bit locations of the information block from the respective first coded bit LLRs and the respective unknown-bit LLRs by performing density evolution or Gaussian approximation, and calculating the first LLR sum based on the first LLRs. In some aspects, the In some aspects, the polar codeword includes an original codeword length of N. In some aspects, the method further includes sorting the plurality of sub-channels based on the first LLRs, selecting K best sub-channels of the plurality of sub-channels in accordance with the first LLRs, setting first original bits of the information block corresponding to the K best sub-channels as information bits, and setting second original bits of the information block corresponding to N-K sub-channels as frozen bits.

In some aspects, the second LLR sum for the known-bit puncturing scheme is calculated by setting a respective known-bit LLR for each coded bit location of the plurality of coded bit locations corresponding to one of the second punctured bit locations to a value greater than zero, and determining respective second coded bit LLRs for remaining ones of the coded bit locations. In some aspects, the information block includes a plurality of original bit locations and the second LLR sum for the known-bit puncturing scheme is calculated by calculating respective second LLRs for the plurality of original bit locations of the information block from the respective second coded bit LLRs and the respective known-bit LLRs by performing density evolution or Gaussian approximation, and calculating the second LLR sum based on the second LLRs.

In some aspects, the polar codeword includes an original codeword length of N and the punctured codeword includes the codeword length of M. In some aspects, the method further includes sorting the plurality of sub-channels based on the second LLRs, selecting K best sub-channels of the plurality of sub-channels, excluding the sub-channels corresponding to the punctured bit locations, in accordance with the second LLRs, setting first original bits of the information block corresponding to the K best sub-channels as information bits, setting second original bits of the information block corresponding to the sub-channels corresponding to the punctured bit locations as frozen bits, and setting third original bits of the information block corresponding to a remaining number of sub-channels as frozen bits, wherein the remaining number of sub-channels is equal to a difference between N-K and N-M sub-channels.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
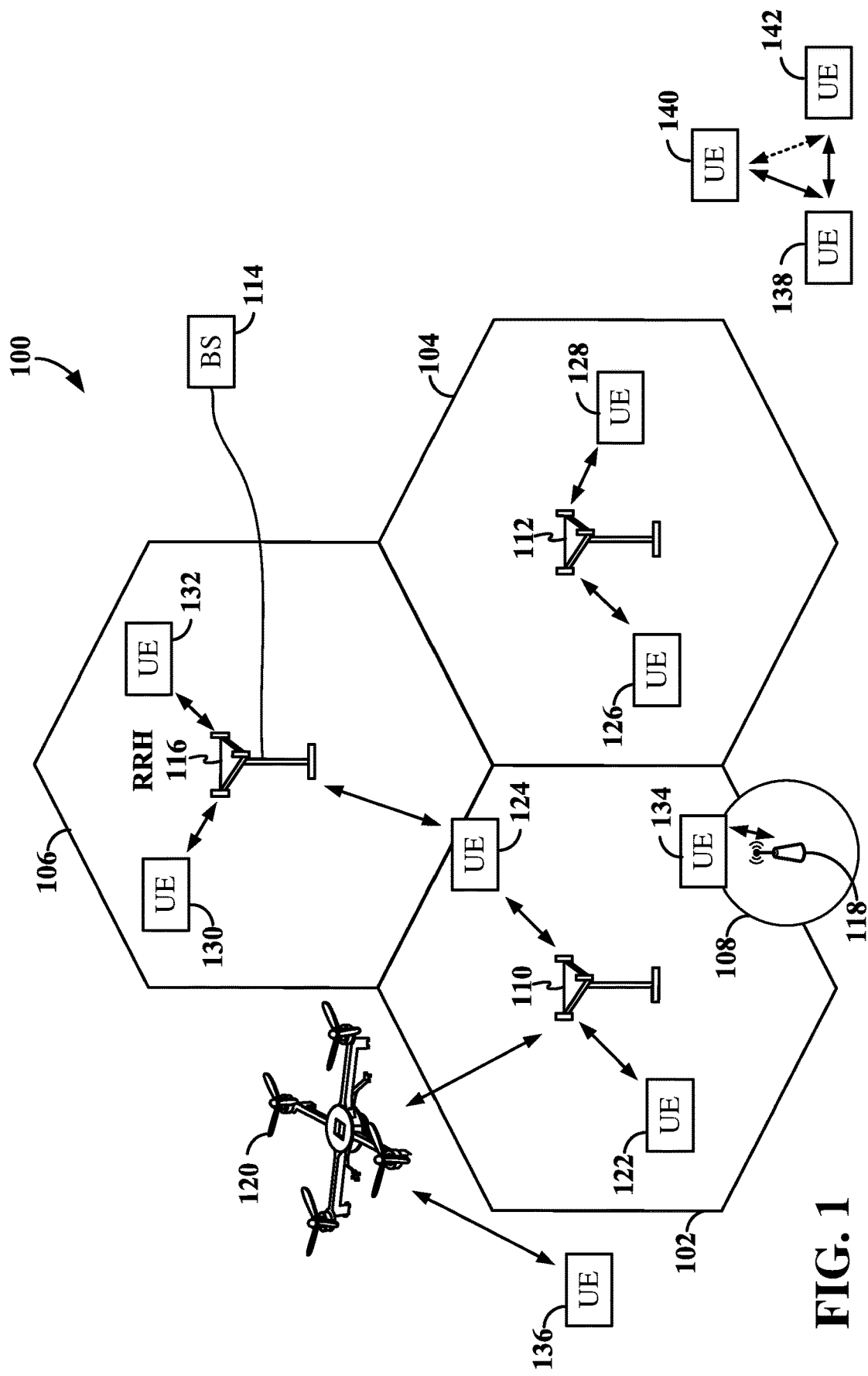
FIG. 1 is a diagram illustrating an example of an access network.

The various concepts presented throughout this disclosure may be implemented across a broad variety of telecommunication systems, network architectures, and communication standards. Referring now to FIG. 1, as an illustrative example without limitation, a simplified schematic illustration of an access network 100 is provided. The access network 100 may be a next generation (e.g., fifth generation (5G)) access network or a legacy (3G or 4G) access network. In addition, one or more nodes in the access network 100 may be next generation nodes or legacy nodes.

The geographic region covered by the access network 100 may be divided into a number of cellular regions (cells), including macrocells 102, 104, and 106, and a small cell 108, each of which may include one or more sectors. Cells may be defined geographically (e.g., by coverage area) and/or may be defined in accordance with a frequency, scrambling code, etc. In a cell that is divided into sectors, the multiple sectors within a cell can be formed by groups of antennas with each antenna responsible for communication with mobile devices in a portion of the cell.

In general, a radio transceiver apparatus serves each cell. A radio transceiver apparatus is commonly referred to as a base station (BS) in many wireless communication systems, but may also be referred to by those skilled in the art as a base transceiver station (BTS), a radio base station, a radio transceiver, a transceiver function, a basic service set (BSS), an extended service set (ESS), an access point (AP), a Node B, an eNode B, or some other suitable terminology.

In FIG. 1, two high-power base stations 110 and 112 are shown in cells 102 and 104; and a third high-power base station 114 is shown controlling a remote radio head (RRH) 116 in cell 106. In this example, the cells 102, 104, and 106 may be referred to as macrocells, as the high-power base stations 110, 112, and 114 support cells having a large size. Further, a low-power base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the low-power base station 118 supports a cell having a relatively small size. Cell sizing can be done according to system design as well as component constraints. It is to be understood that the access network 100 may include any number of wireless base stations and cells. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In some examples, the base stations may be interconnected to one another and/or to one or more other base stations or network nodes (not shown) in the access network 100 through various types of backhaul interfaces such as a direct physical connection, a virtual network, or the like using any suitable transport network.

The access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology.

Within the present document, a "mobile" apparatus need not necessarily have a capability to move, and may be stationary. Some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, and a personal digital assistant (PDA). A mobile apparatus may additionally be an "Internet of things" (IoT) device such as an automotive or other transportation vehicle, a satellite radio, a global positioning system (GPS) device, a logistics controller, a drone, a multi-copter, a quad-copter, a smart energy or security device, municipal lighting, water, or other infrastructure; industrial automation and enterprise devices; consumer and wearable devices, such as eyewear, a wearable camera, a smart watch, a health or fitness tracker, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc.

Within the access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with low-power base station 118; and UE 136 may be in communication with mobile base station 120. Here, each base station 110, 112, 114, 118, and 120 may be configured to provide an access point to a core network (not shown) for all the UEs in the respective cells.

In another example, the quadcopter 120 may be configured to function as a UE. For example, the quadcopter 120 may operate within cell 102 by communicating with base station 110.

The air interface in the access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), or other suitable multiplexing schemes.

Within the access network 100, during a call with a scheduling entity, or at any other time, a UE may monitor various parameters of the signal from its serving cell as well as various parameters of neighboring cells. Further, depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity.

Base stations are not the only entities that may function as a scheduling entity. That is, in some examples, a UE may function as a scheduling entity, scheduling resources for one or more subordinate entities (e.g., one or more other UEs). For example, UE 138 is illustrated communicating with UEs 140 and 142. In this example, the UE 138 is functioning as a scheduling entity, and UEs 140 and 142 utilize resources scheduled by the UE 138 for wireless communication. A UE may function as a scheduling entity in a peer-to-peer (P2P) network, and/or in a mesh network. In a mesh network example, UEs 140 and 142 may optionally communicate directly with one another in addition to communicating with the scheduling entity 138.

Figure 2:
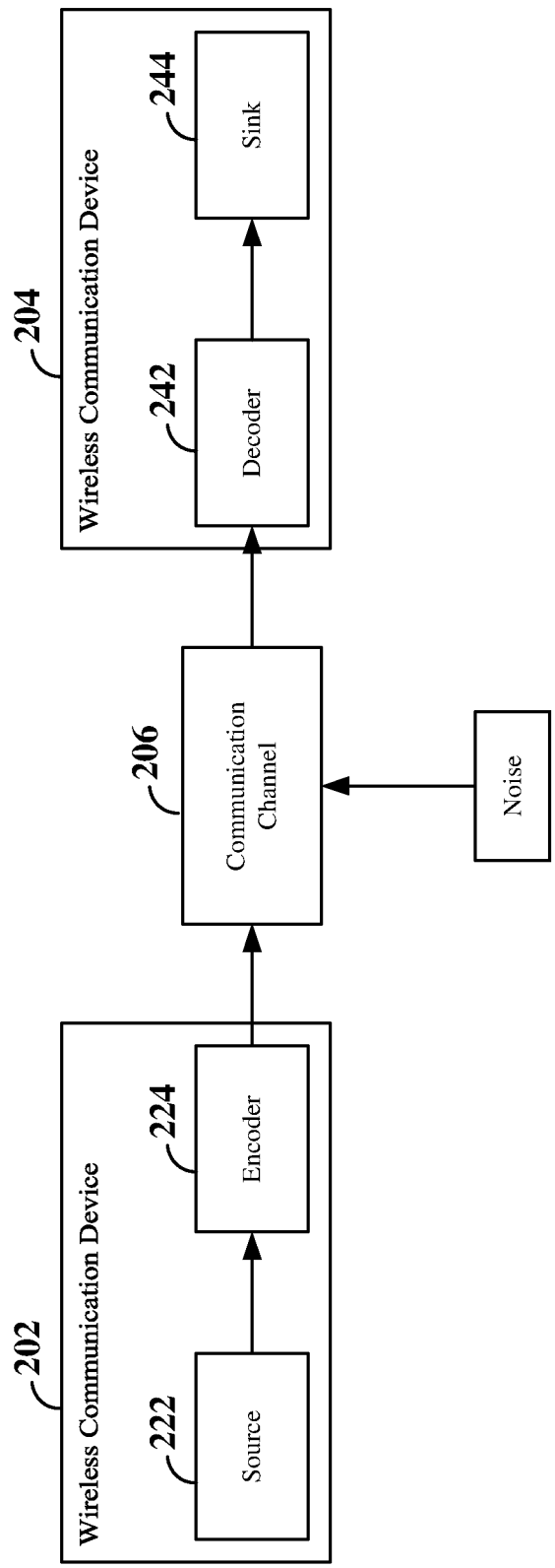
FIG. 2 is a schematic illustration of wireless communication utilizing block codes.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, a source 222 within the first wireless communication device 202 transmits a digital message over a communication channel 206 (e.g., a wireless channel) to a sink 244 in the second wireless communication device 204. One issue in such a scheme that must be addressed to provide for reliable communication of the digital message, is to take into account the noise that affects the communication channel 206.

Block codes, or error correcting codes are frequently used to provide reliable transmission of digital messages over such noisy channels. In a typical block code, an information message or sequence is split up into blocks, each block having a length of K bits. An encoder 224 at the first (transmitting) wireless communication device 202 then mathematically adds redundancy to the information message, resulting in codewords having a length of N, where N>K. Here, the coding rate R is the ratio between the message length and the block length: i.e., R=K/N. Exploitation of this redundancy in the encoded information message is the key to reliability of the message, enabling correction for any bit errors that may occur due to the noise. That is, a decoder 242 at the second (receiving) wireless communication device 204 can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

Polar codes are linear block error correcting codes invented in 2007 by Erdal Arikan, and currently known to those skilled in the art. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

Polar codes may be considered as block codes (N, K). While it would be flexible for an encoder 124 to be able to select the number of coded bits N, with polar codes, the codeword length N must be a power of 2 (e.g., 256, 512, 1024, etc.) because the original construction of a polarizing matrix is based on the Kronecker product of $$\begin{bmatrix} 1 & 0 \\ 1 & 1 \end{bmatrix}.$$

However, in a given communication system, it is generally not possible to guarantee that a resource can afford always to utilize this limited set of codeword lengths. To support the variable size of resources in a practical system, the block size of polar codes must be flexible to the resource size.

Puncturing is widely used to obtain length-compatible polar codes having a codeword whose block length is not a power of 2. For example, to obtain a 1000-bit code word length, 24 bits may be punctured from a $2^{10}$=1024-bit code word. According to various aspects of the present disclosure, puncturing may be utilized to obtain codewords of arbitrary length (e.g., lengths that are not necessarily a power of 2).

When performing codeword puncturing, the selection of which bits to puncture (the puncturing pattern) is an important concern and can affect the efficiency of the algorithm. Even if it is possible, it is not desirable to perform an exhaustive search of all puncture patterns to find the optimal puncture pattern, due to the extensive computation complexity that would be required.

It has been known in the art to employ random puncturing patterns, among other various puncture patterns. Among the known puncturing patterns, a uniform puncturing pattern provides good performance One example of a uniform puncturing pattern is described in Kai Niu et al., BEYOND TURBO CODES: RATE-COMPATIBLE PUNCTURED POLAR CODES, 2013 IEEE International Conference on Communications. Details of this algorithm are known to those of ordinary skill in the art and are not described in detail in the present disclosure.

Another aspect of a puncturing algorithm or puncturing scheme is how the decoder is to treat the punctured bits. In some examples of codeword puncturing, the punctured bits may be considered to be unknown bits. That is, the decoder may set the log-likelihood ratio (LLR) for the punctured bits to zero, indicating that the punctured bits are unknown. The LLR represents the probability of correctly decoding the bit and generally ranges from zero to one, with increasing probability as the LLR approaches one. One example of a puncturing scheme where the punctured bits are considered unknown bits is described in Dong-Min Shin et al., DESIGN OF LENGTH-COMPATIBLE POLAR CODES BASED ON THE REDUCTION OF POLARIZING MATRICES, IEEE Transactions on Communications, Vol. 61, No. 7, July 2013. Details of this algorithm are known to those of ordinary skill in the art and are not described in detail in the present disclosure.

In other examples of codeword puncturing, the punctured bits may be considered to be known bits. That is, the decoder may set the LLR for the punctured bits to be very high (e.g., to infinity) indicating that the punctured bits have a known value of zero. The construction of polar codes using a puncturing scheme where the punctured bits are considered known bits was introduced by Runxin Wang and Rongke Liu, A NOVEL PUNCTURING SCHEME FOR POLAR CODES, IEEE Communications Letters, Vol. 18, No. 12, December 2014. Details of this algorithm are known to those of ordinary skill in the art and are not described in detail in the present disclosure.

According to aspects of the present disclosure, it has been observed that, when the punctured bits are considered unknown bits, a puncturing scheme generally provides better performance than known-bit puncturing when utilizing lower coding rates (e.g., when the coding rate R is less than ½). On the other hand, considering the punctured bits as known bits generally provides better performance than unknown-bit puncturing when utilizing high coding rates (e.g., when the coding rate R is higher than ½). Furthermore, the performance of the encoder may additionally depend on other factors or parameters, such as the signal to noise ratio (SNR) experienced on the communication channel.

According to an aspect of the present disclosure, an encoder may select between such known-bit puncturing and unknown-bit puncturing in order to achieve the best performance in any conditions, independent of the coding rate or SNR being experienced.

Figure 3:
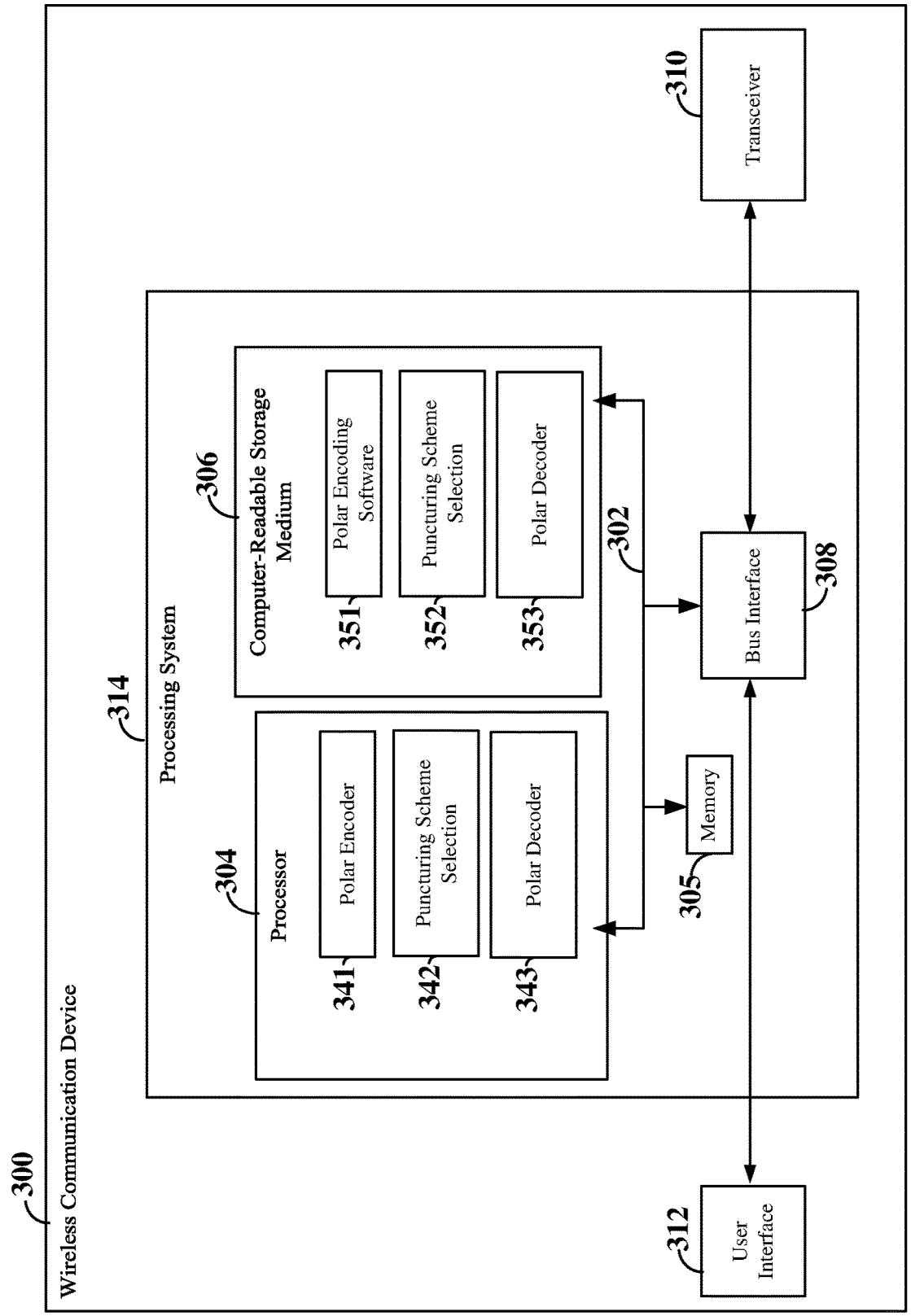
FIG. 3 is a block diagram illustrating an example of a hardware implementation for a wireless communication device employing a processing system according to some embodiments.

FIG. 3 is a block diagram illustrating an example of a hardware implementation for a wireless communication device 300 employing a processing system 314. For example, the wireless communication device 300 may be a user equipment (UE), a base station, or any other suitable apparatus or means for wireless communication.

In accordance with various aspects of the disclosure, an element, or any portion of an element, or any combination of elements may be implemented with a processing system 314 that includes one or more processors 304. Examples of processors 304 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 304, as utilized in a wireless communication device 300, may be used to implement any one or more of the processes described below and illustrated in FIGS. 4-8.

In this example, the processing system 314 may be implemented with a bus architecture, represented generally by the bus 302. The bus 302 may include any number of interconnecting buses and bridges depending on the specific application of the processing system 314 and the overall design constraints. The bus 302 links together various circuits including one or more processors (represented generally by the processor 304), a memory 305, and computer-readable media (represented generally by the computer-readable medium 306). The bus 302 may also link various other circuits such as timing sources, peripherals, voltage regulators, and power management circuits, which are well known in the art, and therefore, will not be described any further. A bus interface 308 provides an interface between the bus 202 and a transceiver 310. The transceiver 310 provides a means for communicating with various other apparatus over a transmission medium. Depending upon the nature of the apparatus, a user interface 312 (e.g., keypad, display, speaker, microphone, joystick) may also be provided.

The processor 304 is responsible for managing the bus 302 and general processing, including the execution of software stored on the computer-readable medium 306. The software, when executed by the processor 304, causes the processing system 314 to perform the various functions described below for any particular apparatus. The computer-readable medium 306 may also be used for storing data that is manipulated by the processor 304 when executing software.

One or more processors 304 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 306. The computer-readable medium 306 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 306 may reside in the processing system 314, external to the processing system 314, or distributed across multiple entities including the processing system 314. The computer-readable medium 306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 304 may include circuitry configured for various functions. For example, the processor 304 may include a polar encoder 341, which may in some examples operate in coordination with polar encoding software 341 stored in the computer-readable storage medium 306. The polar encoder 341 may be configured to polar code an information block to produce a polar codeword having a codeword length of N. For example, the information block may be represented as an information bit vector $u=(u_1, u_2, \ldots, u_N)$. The polar encoder 341 may polar code the information bit vector to produce the polar codeword as an encoded bit vector $c=(c_1, c_2, \ldots, c_N)$ using a generating matrix $G_N=B_N F^{\otimes n}$, where $B_N$ is the bit-reversal permutation matrix for successive cancellation (SC) decoding (functioning in some ways similar to the interleaver function used by a turbo coder in LTE networks) and $F^{\otimes n}$ is the $n^{th}$ Kronecker power of F. The basic matrix F may be represented as $$\begin{bmatrix} 1 & 0 \\ 1 & 1 \end{bmatrix}.$$

The matrix $F^{\otimes n}$ is generated by raising the basic 2×2 matrix F by the $n^{th}$ Kronecker power. This matrix is a lower triangular matrix, in that all the entries above the main diagonal are zero. For example, the matrix of $F^{\otimes n}$ may be expressed as:

$$F^{\otimes n} = \begin{bmatrix} 1 & 0 & 0 & & 0 & 0 & 0 & 0 \\ 1 & 1 & 0 & \ldots & 0 & 0 & 0 & 0 \\ 1 & 0 & 1 & & 0 & 0 & 0 & 0 \\ \vdots & & & \ddots & & & & \vdots \\ 1 & 0 & 0 & & 1 & 0 & 0 & 0 \\ 1 & 1 & 0 & \ldots & 1 & 1 & 0 & 0 \\ 1 & 0 & 1 & & 1 & 0 & 1 & 0 \\ 1 & 1 & 1 & & 1 & 1 & 1 & 1 \end{bmatrix}$$

The polar encoder 341 may then generate the polar codeword as:

$$c_1^N = u_1^N G_N = u_1^N B_N F^{\otimes n}$$

Thus, the information bit vector u may include a number (N) of original bits that may be polar coded by the generating matrix $G_N$ to produce a corresponding number (N) of coded bits in the polar codeword c. In some examples, the information bit vector u may include a number of information bits, denoted K, and a number of frozen bits, denoted F. Frozen bits are bits that are fixed as 0 or 1. Thus, the value of the frozen bits may generally be known at both the transmitting device and the receiving device. The polar encoder 341 may determine the number of information bits and the number of frozen bits based on the coding rate R. For example, the polar encoder 341 may select a coding rate R from a set of one or more coding rates and select K=N×R bits in the information block to transmit information. The remaining (N−K) bits in the information block may then be fixed as frozen bits F.

In order to determine which information block bits to set as frozen bits, the polar encoder 341 may further analyze the wireless channel over which the polar codeword may be sent. For example, the wireless channel for transmitting the polar codeword may be divided into a set of sub-channels, such that each encoded bit in the polar codeword is transmitted over one of the sub-channels. Thus, each sub-channel may correspond to a particular coded bit location in the polar codeword (e.g., sub-channel-1 may correspond to coded bit location containing coded bit $c_1$). The polar encoder 341 may identify the K best sub-channels for transmitting the information bits and determine the original bit locations in the information block contributing to (or corresponding to) the K best sub-channels. For example, based on the generating matrix, one or more of the original bits of the information block may contribute to each of the coded bits of the polar codeword. Thus, based on the generating matrix, the polar encoder 341 may determine K original bit locations in the information block corresponding to the K best sub-channels, designate the K original bit locations for information bits and designate the remaining original bit locations in the information block for fixed bits.

In some examples, the polar encoder 341 may determine the K best sub-channels by performing density evolution or Gaussian approximation. Density evolution is generally known to those skilled in the art, and therefore the details thereof are not described herein. For example, construction of polar codes based on density evolution is described in R. Mori and T. Tanaka PERFORMANCE OF POLAR CODES WITH THE CONSTRUCTION USING DENSITY EVOLUTION, IEEE Commun. Lett., vol. 13, no. 7, pp. 519-521, July 2009. Gaussian approximation is a lower complexity version of density evolution, and is also generally known to those skilled in the art. For example, construction of polar codes based on Gaussian approximation is described in V. Miloslavskaya, SHORTENED POLAR CODES, IEEE Trans. on Information Theory, June 2015.

The polar encoder 341 may perform density evolution or Gaussian approximation to calculate a respective bit error probability (BEP) and/or log likelihood ratio (LLR) for each of the for each of the original bit locations. For example, the LLRs of the coded bit locations are known from the sub-channel conditions (e.g., based on the respective SNRs of the sub-channels). Thus, since one or more of the original bits of the information block may contribute to each of the coded bits of the codeword, the LLRs of each of the original bit locations may be derived from the known LLRs of the coded bit locations by performing density evolution or Gaussian approximation. Based on the calculated original bit location LLRs, the polar encoder 341 may sort the sub-channels and select the K best sub-channels (e.g., "good" sub-channels) to transmit the information bits. The polar encoder 341 may then set the original bit locations of the information block corresponding to the K best sub-channels as including information bits and the remaining original bit locations corresponding to the N−K sub-channels (e.g., "bad" sub-channels) as including frozen bits.

The polar encoder 341 may further be configured to puncture the polar codeword to produce a punctured codeword. Puncturing may be utilized to obtain codewords of arbitrary length (e.g., lengths that are not necessarily a power of 2). In some examples, puncturing may be performed using a puncturing pattern that identifies which coded bits to puncture. The puncturing pattern may be represented as a puncturing vector $P=(P_1, P_2, \ldots, P_N)$ including pattern bits P at locations 1−N. The value of each pattern bit location of the puncturing vector P determines whether a coded bit at a corresponding coded bit location in the coded bit vector c is punctured or kept. For example, if the value at a pattern bit location in the puncturing pattern is zero, the coded bit at the corresponding coded bit location in the polar codeword may be punctured (removed), whereas if the value is 1, the coded bit at that coded bit location may be kept.

In various aspects of the disclosure, a uniform or quasi-uniform puncturing pattern may be utilized. However, those skilled in the art will recognize that non-uniform (e.g., random) puncturing may be utilized within the scope of the present disclosure. In some examples, the polar encoder 341 may generate the uniform or quasi-uniform puncturing pattern from an initial puncturing pattern including one or more initial punctured bit locations. An example of an initial puncturing pattern is one in which all of the elements have a value of 1 except for the last N-M elements, which have a value of 0. Here, N is the codeword length, and N-M is the desired block length after puncturing. As a result of the bit-reversal permutation $B_N$ applied to the information block, in order to maintain correspondence between the puncturing pattern and the resulting polar codeword, bit-reversal permutation may also be performed on the initial puncturing pattern to produce a final puncturing pattern that is similar to a uniform puncturing pattern. The punctured bit locations may be different in the final puncturing pattern than in the initial puncturing pattern based on the bit-reversal permutation applied. The final puncturing pattern functions as a mask, puncturing N-M coded bits of the polar codeword to which it is applied.

The polar encoder 341 may further be configured to utilize either an unknown-bit puncturing scheme or a known-bit puncturing scheme with the same puncturing pattern. In an unknown-bit puncturing scheme, the values of the punctured coded bits are unknown at the decoder, and therefore, the decoder may initialize the corresponding LLRs of the punctured bits to zero. In a known-bit puncturing scheme, the values of the punctured coded bits are known, and therefore, the decoder may initialize the corresponding LLRs of the punctured bits to infinity.

With an unknown-bit puncturing scheme, the polar encoder 341 may select the locations of the information bits and frozen bits based on the calculated LLRs, as described above. However, with a known puncturing scheme, the polar encoder 341 may further be configured to select the information bit locations and frozen bit locations in the information block based on not only the LLRs (or BEPs), but also on the puncturing pattern, to ensure that the values of the punctured bits are "known" to the receiver. For example, the polar encoder 341 may select the locations of the frozen bits such that the punctured bits are generated from only the frozen bits, and therefore, their values can be known to the receiver.

Using the above example of the initial puncturing pattern in which the last N-M elements have a value of 0, the polar encoder 341 may also designate the last N-M elements of the information block as frozen bits, each having a known value (e.g., 0). The remaining frozen bit locations (e.g., the difference between N-K and N-M, where (N-K)>(N-M)) may be selected based on the LLRs, as described above. Thus, after polar coding and bit-reversal permutation, each of the coded bits at the punctured bit locations in the puncturing pattern may be obtained by using only the N-M frozen bits.

This may be more easily understood using the lower triangular generating matrix $F^{\otimes n}$ shown above. For example, as can be seen above, in the last column, all the values are zero, except for the last row, which includes a 1. Since the last original bit in the information block is set to 0 (e.g., as a frozen bit), the last column may be removed as it does not contribute to the values of the coded bits. In addition, if the last column is removed, then the last row may be removed as well. If the last column and the last row are removed, then the value of the corresponding punctured bit will also be zero. Upon removal of the last column and row, the values in the remaining last column are now are zero, except for the last row. Therefore, the process may be repeated by removing the remaining last column and last row. This applies to each removed column: when removed, the corresponding bottom row may also removed. This implies that the last N-M columns and rows may be removed to effect puncturing of the coded bits that would have been generated from the last N-M frozen bits. Because the puncture starts from the last column of the matrix and continues to the left one by one (e.g., based on the number of punctured bits), the value of the punctured bits will be known with values of zeros as long as the last N-M original bits of the information block are set as frozen bits with values of zeros.

Although in various aspects of the disclosure, the punctured codeword may be generated by modifying the generating matrix, as described above, this type of puncturing (e.g., puncturing as part of the polar coding) is typically more complex than performing puncturing after generation of the polar codeword. Therefore, the puncturing schemes discussed below assume that puncturing is performed after the generation of the polar codeword.

In various aspects of the disclosure, the processor 304 may further include puncturing scheme selection circuitry 342, which may in some examples operate in coordination with puncturing scheme selection software 352 stored in the computer-readable medium 306. The puncturing scheme selection circuitry 342 may be configured to select between the unknown-bit puncturing scheme and the known-bit puncturing scheme and provide the selected puncturing scheme to the polar encoder 342 for use in polar coding and puncturing.

In some examples, the puncturing scheme selection circuitry 342 may calculate a respective LLR sum for each of the unknown-bit puncturing scheme and the known bit puncturing scheme and select the puncturing scheme with the greatest LLR sum. For example, the puncturing scheme selection circuitry 342 may calculate the LLR sum for the unknown-bit puncturing scheme by considering the coded bit locations corresponding to the final punctured bit locations as including unknown bits and setting the unknown-bit LLRs of each of those unknown bit locations to 0. The LLR sum for the unknown-bit puncturing scheme may then be computed by performing density evolution or Gaussian approximation, as described above, to calculate the original bit location LLRs and determining the sum of the calculated original bit location LLRs.

Similarly, the puncturing scheme selection circuitry 342 may calculate the LLR sum for the known-bit puncturing scheme by considering the coded bit locations corresponding to the final punctured bit locations as including known bits and setting the initial LLRs of each of those known bit locations to infinity. The LLR sum for the known-bit puncturing scheme may then be computed by performing density evolution or Gaussian approximation, as described above, to calculate the original bit location LLRs and determining the sum of the calculated original bit location LLRs.

The puncturing scheme selection circuitry 342 may further be configured to provide the selected puncturing scheme to the receiving wireless communication device to enable the decoder at the receiving wireless communication device to initialize the values of the LLRs of the punctured bits with either 0 or infinity. In some examples, the puncturing scheme selection circuitry 342 may be configured to transmit an explicit indication of the selected puncturing scheme to the receiving wireless communication device. For example, a puncturing scheme indication may be transmitted, for example, over a control channel.

Further, the processor 304 may include a polar decoder 343, which may in some examples operate in coordination with polar decoding software 353 stored in the computer-readable medium 306. The polar decoder 343 may be configured to receive a punctured polar codeword and decode the punctured polar codeword to produce the original information block. In some examples, the polar decoder 343 may perform successive cancellation (SC) polar decoding or SC polar list decoding to decode the punctured polar codeword.

In various aspects of the disclosure, the polar decoder 343 may determining whether the punctured bits in the punctured polar codeword are considered known bits or unknown bits. If the punctured bits are considered unknown bits, the polar decoder 343 may set the LLR of each of the punctured bits to zero. However, if the punctured bits are considered known bits, the polar decoder 343 may set the LLR of each of the punctured bits to infinity.

In some examples, the polar decoder 343 may determine whether the punctured bits are considered known bits or unknown bits based on an explicit indication of the selected puncturing scheme from the transmitting wireless communication device. For example, the puncturing scheme indication may be received, for example, over a control channel.

In other examples, the polar decoder 343 may determine whether the punctured bits are considered known bits or unknown bits based on one or more parameters corresponding to channel coding of the punctured polar codeword. The polar decoder 343 may then derive whether the punctured bits are considered known bits or unknown bits in accordance with the one or more parameters. For example, the polar decoder 343 may utilize the coding rate to determine whether the punctured bits are considered known bits or unknown bits. In an example, the polar decoder 343 may determine that the punctured bits are considered known bits if the coding rate is greater than a coding rate threshold, and may determine that the punctured bits are considered unknown bits if the coding rate is not greater than the coding rate threshold. For example, the coding rate threshold may be ½.

Figure 4:
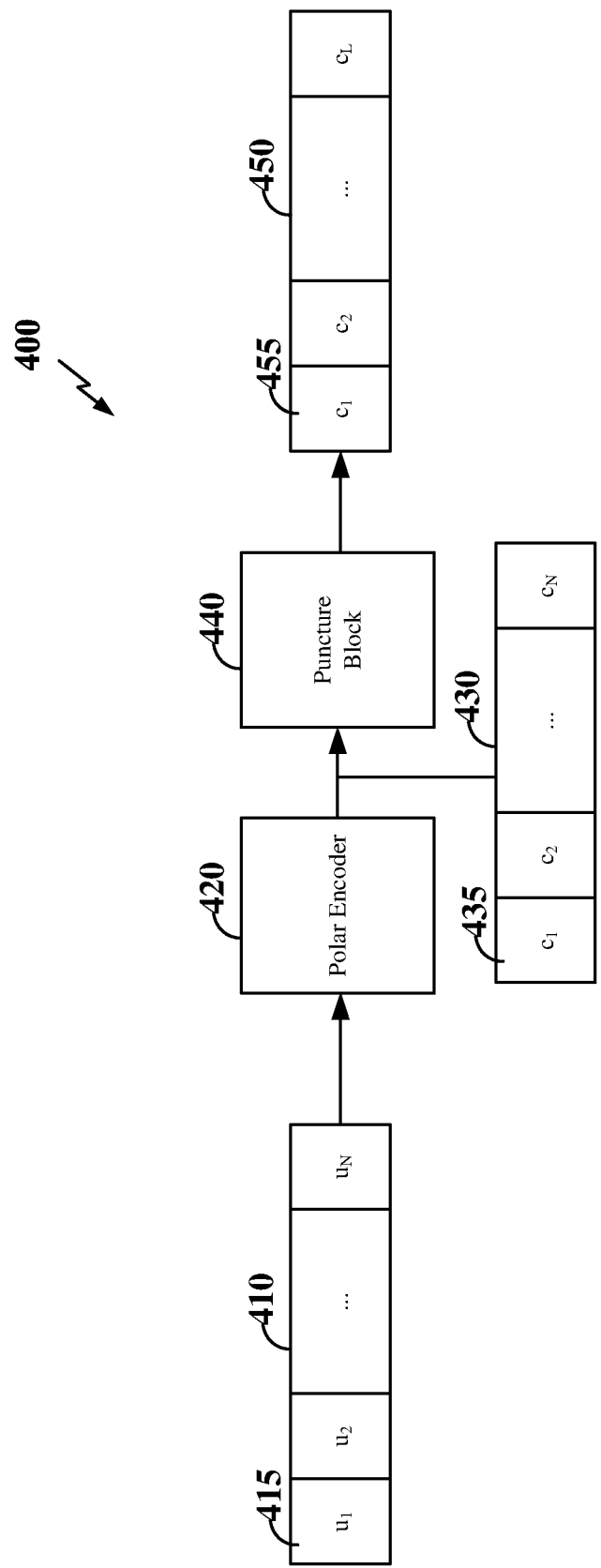
FIG. 4 is a diagram illustrating an example of polar coding and puncturing according to some embodiments.

FIG. 4 is a diagram illustrating an example operation 400 of polar coding and puncturing according to some embodiments. In FIG. 4, an information block 410 is provided including N original bit locations 415, each containing an original bit ($u_1, u_2, \ldots, u_N$). Each of the original bits corresponds to an information bit or a frozen bit. The information block 410 is received by a polar encoder 420. The polar encoder 420 polar encodes the information block to produce a polar codeword 430 including N coded bit locations 435, each containing a coded bit ($c_1, c_2, \ldots, c_N$).

The polar codeword 430 is received by a puncture block 440. The puncture block 440 applies a puncturing pattern to the polar codeword to puncture (N-M) coded bits from the polar codeword to produce a polar codeword having a codeword length of L, where L=(N-M). Thus, at the output of the puncture block 440 is a punctured codeword 450 including L coded bit locations 455, each including one of the non-punctured coded bits ($c_1, c_2, \ldots, c_L$). It should be noted that the polar encoder 420 and puncture block 440 may, in some examples, correspond to the polar encoder 341 and polar encoding software 351 shown and described above in connection with FIG. 3.

Figure 5:
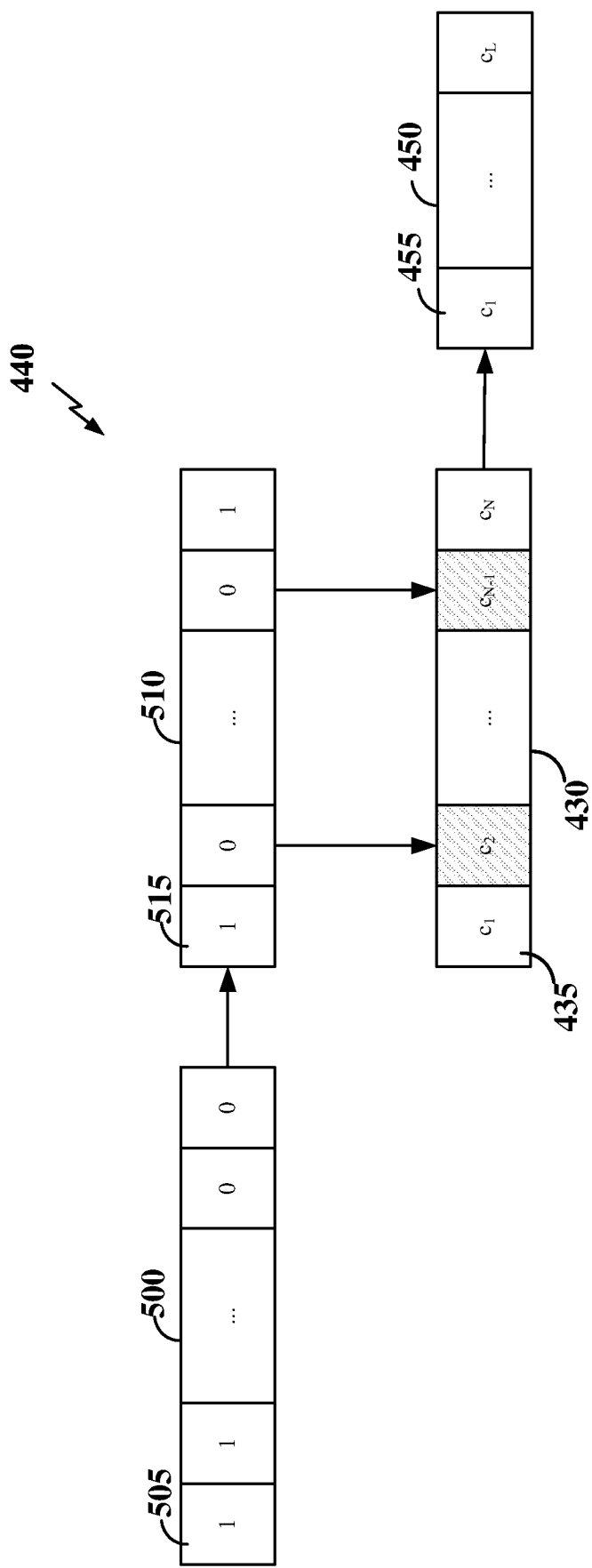
FIG. 5 is a diagram illustrating an example of puncturing according to some embodiments.

An example operation of the puncture block 440 is shown in FIG. 5. In FIG. 5, an initial puncturing pattern 500 is generated including a plurality pattern bit locations 505. Each of the pattern bit locations 505 corresponds to one of the coded bit locations 435 of the polar codeword 430 generated by the polar encoder 420 shown in FIG. 4. The value of each pattern bit location 505 determines whether a coded bit at a corresponding coded bit location 435 in the polar codeword 430 is punctured or kept. For example, if the value at a pattern bit location in the puncturing pattern is zero, the coded bit at the corresponding coded bit location in the polar codeword may be punctured (removed), whereas if the value is 1, the coded bit at that coded bit location may be kept. In the example shown in FIG. 5, the value of the last N-M pattern bit locations 505 is set to zero.

As a result of the bit-reversal permutation applied to the information block when generating the polar codeword 400, in order to maintain correspondence between the puncturing pattern 500 and the resulting polar codeword 430, bit-reversal permutation may also be performed on the initial puncturing pattern 500 to produce a final puncturing pattern 510 that is similar to a uniform puncturing pattern. The final puncturing pattern 510 includes the same number of pattern bit locations 515 as the initial puncture pattern 500, but as shown in FIG. 5, the punctured bit locations may be different in the final puncturing pattern 510 than in the initial puncturing pattern 500 based on the bit-reversal permutation applied. The final puncturing pattern 510 may then be applied to the polar codeword 430 and function as a mask, puncturing N-M coded bits of the polar codeword 430 to produce the punctured polar codeword 450 having a codeword length of L. In the example shown in FIG. 5, coded bits $c_2$ and $c_{N-1}$ are illustrated as being punctured, for simplicity.

Figure 6:
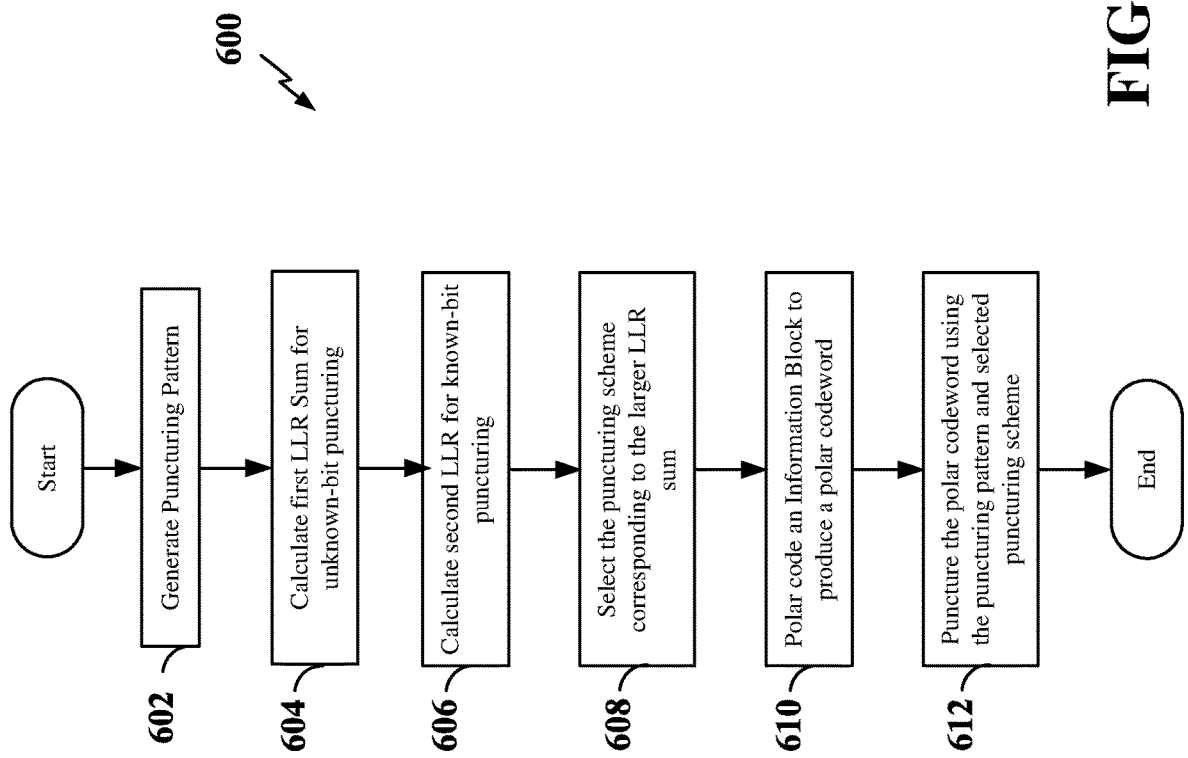
FIG. 6 is a flow chart illustrating an exemplary process for polar coding according to some embodiments.

FIG. 6 is a flow chart illustrating an exemplary process 600 for polar coding according to some aspects of the present disclosure. In some examples, the process 600 may be implemented by a wireless communication device as described above and illustrated in FIGS. 1-3. In some examples, the process 600 may be implemented by any suitable means for carrying out the described functions.

At block 602, the wireless communication device may generate a puncturing pattern. In some examples, the wireless communication device may generate an initial puncturing pattern $P_u=(1\ 1\ 1\ \ldots\ 1\ 0\ 0\ \ldots\ 0)_N$. The puncture pattern $P_u$ is represented by a vector with all elements having a value of 1 except for the last N-M elements, which have a value of 0. Here, N is the codeword length, and (N-M) is the desired block length after puncturing. As above, if a value in this vector is zero, then the coded bit at the corresponding coded bit location of the polar codeword will be punctured. If the value is 1, then the coded bit at the corresponding coded bit location of the polar codeword will be kept. To account for bit-reversal permutation in the polar encoder, the wireless communication device may also perform bit-reversal permutation on the initial puncturing pattern to produce a final puncturing pattern P. For example, the polar encoder 341 shown and described above in connection with FIG. 3 and/or the puncture block 440 shown and described above in connection with FIGS. 4 and 5 may generate the puncturing pattern.

At block 604, the wireless communication device may calculate a first LLR sum for an unknown-bit puncturing scheme by considering the coded bit locations corresponding to the punctured bit locations as including unknown bits. In some examples, the wireless communication device may set an initial LLR of each punctured coded bit location to zero, such that the punctured bits are considered unknown.

The wireless communication device may then perform density evolution or Gaussian approximation to calculate the LLRs of the original bit locations of the information block based on the LLRs of the punctured bit locations and the known LLRs of the other coded bit locations (e.g., non-punctured coded bit locations). The wireless communication device may then calculate the first LLR sum for the unknown-bit puncturing scheme as the sum of the original bit location LLRs. For example, the puncturing scheme selection circuitry 342 shown and described above in connection with FIG. 3 may calculate the first LLR sum.

At block 606, the wireless communication device may calculate a second LLR sum for a known-bit puncturing scheme by considering the coded bit locations corresponding to the punctured bit locations as including known bits. In some examples, the wireless communication device may set an initial LLR of each punctured coded bit location to infinity, such that the punctured bits are considered known. The wireless communication device may then perform density evolution or Gaussian approximation to calculate the LLRs of the original bit locations of the information block based on the LLRs of the punctured bit locations and the known LLRs of the other coded bit locations (e.g., non-punctured coded bit locations). The wireless communication device may then calculate the second LLR sum for the known-bit puncturing scheme as the sum of the original bit location LLRs. For example, the puncturing scheme selection circuitry 342 shown and described above in connection with FIG. 3 may calculate the first LLR sum.

At block 608, the wireless communication device may compare the first LLR sum with the second LLR sum, and may select the puncturing scheme corresponding to the larger sum. For example, the puncturing scheme selection circuitry 342 shown and described above in connection with FIG. 3 may select the puncturing scheme.

At block 610, the wireless communication device may polar code an information block including information bits and frozen bit to produce a polar codeword. For example, the polar encoder 341 shown and described above in connection with FIG. 3 and/or the polar encoder 420 shown and described above in connection with FIG. 4 may polar code the information block. At block 612, the wireless communication device may puncture the polar codeword utilizing the final puncture pattern P, treating the punctured bits as known bits or unknown bits in accordance with which puncturing scheme resulted in the larger LLR sum, as described above. For example, the polar encoder 341 shown and described above in connection with FIG. 3 and/or the puncture block 440 shown and described above in connection with FIGS. 4 and 5 may puncture the polar codeword to produce a punctured polar codeword having a codeword length other than a power of 2.

Figure 7:
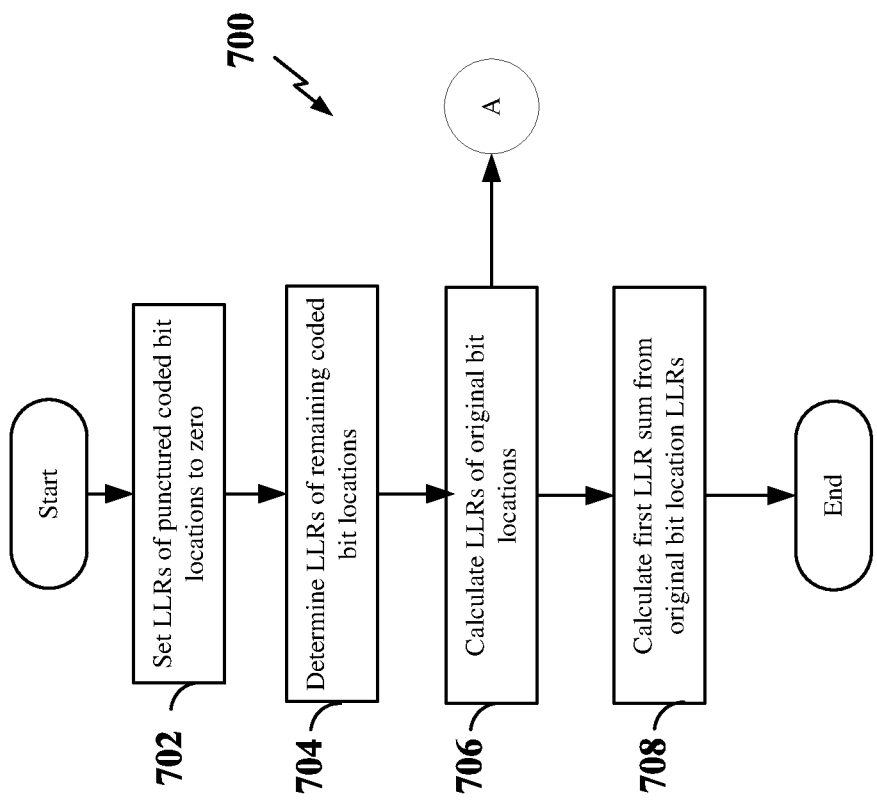
FIG. 7 is a flow chart illustrating an exemplary process for calculating the first LLR sum for an unknown-bit puncturing scheme according to some embodiments.

FIG. 7 is a flow chart illustrating an exemplary process 700 for calculating the first LLR sum for an unknown-bit puncturing scheme according to some aspects of the present disclosure. In some examples, the process 700 may be implemented by a wireless communication device as described above and illustrated in FIGS. 1-3. In some examples, the process 700 may be implemented by any suitable means for carrying out the described functions.

At block 702, the wireless communication device may set the initial LLRs of the punctured coded bit locations to zero. In addition, at block 704, the wireless communication device may determine the LLRs of the remaining coded bit locations (e.g., based on sub-channel conditions). For example, the puncturing scheme selection circuitry 342 shown and described above in connection with FIG. 3 may set the LLR's of the punctured coded bit locations to zero and determine the LLRs of the remaining bit locations.

At block 706, the wireless communication device may calculate the LLRs of the original bit locations of the information block by performing density evolution or Gaussian approximation. At block 708, the wireless communication device may then calculate the first LLR sum for the unknown-bit puncturing scheme from the original bit location LLRs. For example, the puncturing scheme selection circuitry 342 shown and described above in connection with FIG. 3 may calculate the original bit location LLRs and calculate the first LLR sum from the calculated original bit location LLRs.

Figure 8:
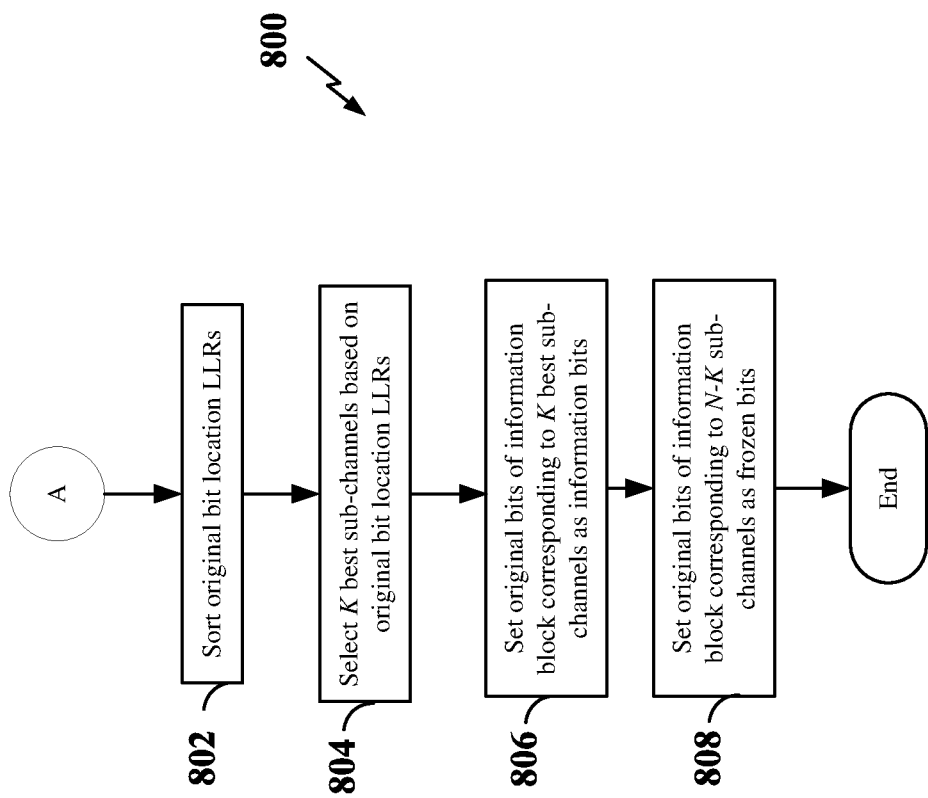
FIG. 8 is a flow chart illustrating an exemplary process for determining the locations of the information bits and frozen bits in the information block when using an unknown-bit puncturing scheme according to some embodiments.

In addition, after calculating the original bit location LLRs at block 706, the process may proceed as indicated by node A to FIG. 8, which illustrates an exemplary process 800 for determining the locations of the information bits and frozen bits in the information block. In some examples, the process 800 may be implemented by a wireless communication device as described above and illustrated in FIGS. 1-3. In some examples, the process 700 may be implemented by any suitable means for carrying out the described functions.

At block 802, the wireless communication device may sort the original bit location LLRs in ascending or descending order. In addition, at block 804, the wireless communication device may select the K best sub-channels based on the sorted original bit location LLRs. In some examples, the K best sub-channels correspond to the K highest original bit location LLRs. For example, the polar encoder 341 shown and described above in connection with FIG. 3 and/or the polar encoder 420 shown and described above in connection with FIG. 4 may sort the original bit location LLRs and select the K best sub-channels therefrom.

At block 806, the wireless communication device may set the original bits of the information block corresponding to the K best sub-channels ("good" sub-channels) as information bits. In addition, at block 808, the wireless communication device may set the original bits of the information block corresponding to the (N−K) sub-channels ("bad" sub-channels) as frozen bits. In some examples, the wireless communication device may fix the frozen bits to the same value (e.g., 1 or 0). For example, the polar encoder 341 shown and described above in connection with FIG. 3 and/or the polar encoder 420 shown and described above in connection with FIG. 4 may set the original bits of the information block as information bits or frozen bits.

Figure 9:
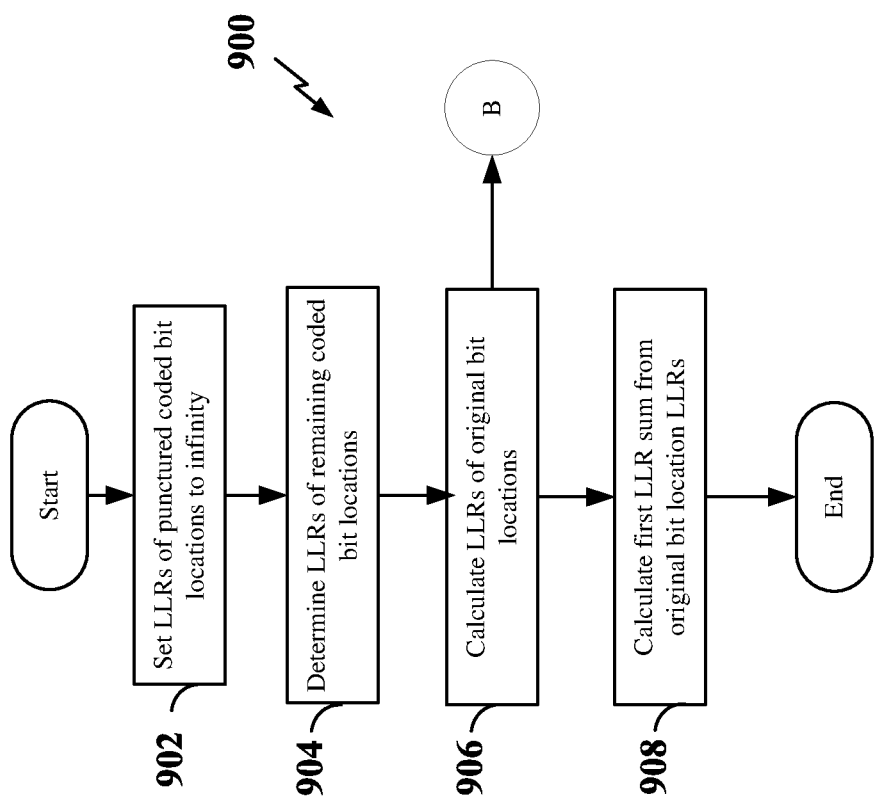
FIG. 9 is a flow chart illustrating an exemplary process for calculating the first LLR sum for a known-bit puncturing scheme according to some embodiments.

FIG. 9 is a flow chart illustrating an exemplary process 900 for calculating the first LLR sum for a known-bit puncturing scheme according to some aspects of the present disclosure. In some examples, the process 900 may be implemented by a wireless communication device as described above and illustrated in FIGS. 1-3. In some examples, the process 900 may be implemented by any suitable means for carrying out the described functions.

At block 902, the wireless communication device may set the initial LLRs of the punctured coded bit locations to infinity. In addition, at block 904, the wireless communication device may determine the LLRs of the remaining coded bit locations (e.g., based on sub-channel conditions). For example, the puncturing scheme selection circuitry 342 shown and described above in connection with FIG. 3 may set the LLR's of the punctured coded bit locations to infinity and determine the LLRs of the remaining bit locations.

At block 906, the wireless communication device may calculate the LLRs of the original bit locations of the information block by performing density evolution or Gaussian approximation. At block 908, the wireless communication device may then calculate the first LLR sum for the unknown-bit puncturing scheme from the original bit location LLRs. For example, the puncturing scheme selection circuitry 342 shown and described above in connection with FIG. 3 may calculate the original bit location LLRs and calculate the first LLR sum from the calculated original bit location LLRs.

Figure 10:
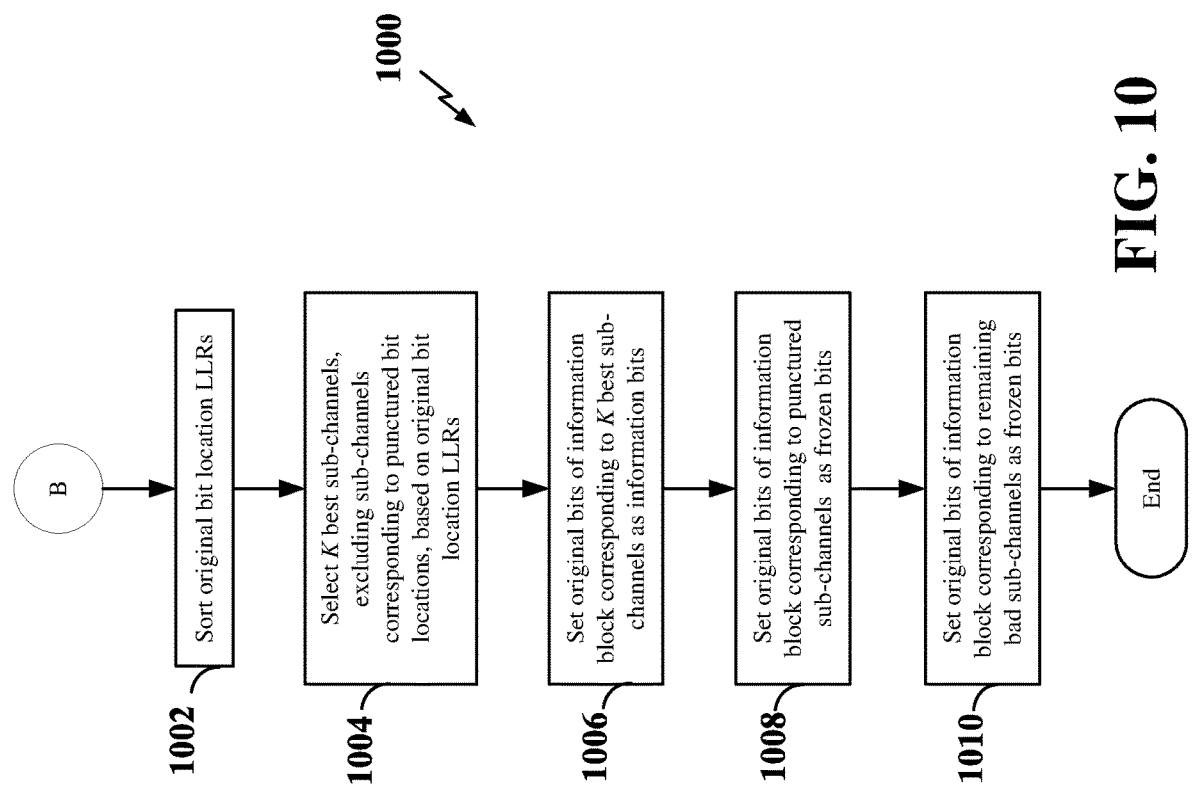
FIG. 10 is a flow chart illustrating an exemplary process for determining the locations of the information bits and frozen bits in the information block when using a known-bit puncturing scheme according to some embodiments.

In addition, after calculating the original bit location LLRs at block 906, the process may proceed as indicated by node B to FIG. 10, which illustrates an exemplary process 1000 for determining the locations of the information bits and frozen bits in the information block. In some examples, the process 1000 may be implemented by a wireless communication device as described above and illustrated in FIGS. 1-3. In some examples, the process 1000 may be implemented by any suitable means for carrying out the described functions.

At block 1002, the wireless communication device may sort the original bit location LLRs in ascending or descending order. In addition, at block 1004, the wireless communication device may select the K best sub-channels, excluding the sub-channels corresponding to the punctured bit locations, based on the sorted original bit location LLRs. In some examples, the K best sub-channels correspond to the K highest original bit location LLRs other than the sub-channels corresponding to the punctured bit locations. For example, the polar encoder 341 shown and described above in connection with FIG. 3 and/or the polar encoder 420 shown and described above in connection with FIG. 4 may sort the original bit location LLRs and select the K best sub-channels therefrom.

At block 1006, the wireless communication device may set the original bits of the information block corresponding to the K best sub-channels ("good" sub-channels) as information bits. In addition, at block 1008, the wireless communication device may set the original bits of the information block corresponding to the sub-channels that correspond to the punctured bit locations as frozen bits. Furthermore, at block 1010, the wireless communication device may set the original bits of the information block corresponding to the remaining "bad" sub-channels (e.g., the remaining number of sub-channels equal to the difference between N–K and N–M sub-channels) as frozen bits. In some examples, the wireless communication device may fix the frozen bits to the same value (e.g., 1 or 0). For example, the polar encoder 341 shown and described above in connection with FIG. 3 and/or the polar encoder 420 shown and described above in connection with FIG. 4 may set the original bits of the information block as information bits or frozen bits.

Figure 11:
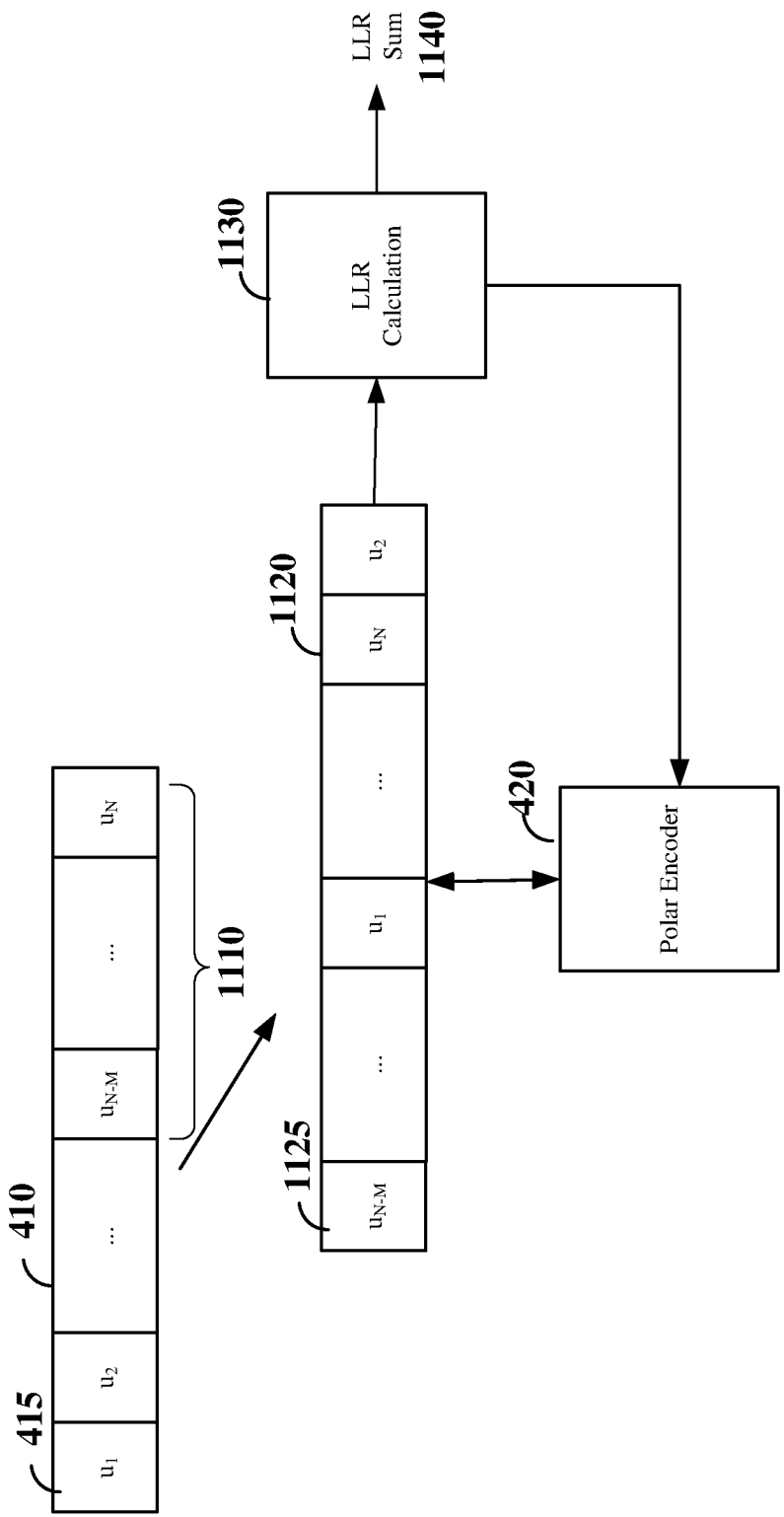
FIG. 11 is a schematic diagram illustrating an example of determining the locations of the information bits and frozen bits in the information block according to some embodiments.

Referring now to FIG. 11, the designation of original bits of an information block as information bits or frozen bits is illustrated. In the example shown in FIG. 11, an initial information block is an N-bit information block 410 including N initial bit locations 415, each containing a respective original bit ($u_1, u_2, \ldots, u_{N-M}, u_N$). A bit-reversal permutation may then be applied to the information block 410 to produce a bit-reversed information block 1120 including N original bit locations 1125 corresponding to the N initial bit locations 415 in the initial information block 410. The bit-reversal permutation effectively re-orders the original bits of the information block 410. For example, the original bit $u_2$ may be in a second initial bit location 415 in the information block 410 and in the last original bit location 1125 of the bit-reversed information block 1120.

The bit-reversed information block 1120 may then be provided to an LLR calculation block 1130 to calculate the individual LLRs of each of the original bit locations 1125 and the LLR sums for each of the puncturing schemes. The LLR calculation block 1130 may be implemented, for example, in the polar encoder 341 or 410 shown and described above in connection with FIGS. 3 and 4 and/or the puncturing scheme selection circuitry 342 shown and described above in connection with FIG. 3. For example, to calculate the individual LLRs and LLR sum for either puncturing scheme, the LLR calculation block 1130 may perform density evolution or Gaussian approximation to determine the individual LLRs for each of the original bit locations 1125 based on the LLR values of the corresponding coded bit locations (not shown). For the unknown-bit puncturing scheme, the LLRs of each of the coded bit locations corresponding to the punctured bit locations are set to zero. For the known-bit puncturing scheme, the LLRs of each of the coded bit locations corresponding to the punctured bit locations are set to infinity. The LLR calculation block 1130 may then calculate the LLR sums 1140 for each of the puncturing schemes using the individual calculated LLRs for each of the original bit locations 1125.

In addition, the LLR calculation block 1130 may provide the individual calculated original bit location LLRs to the polar encoder 420 to set each of the original bits in the bit-reversed information block 1120 as an information bit or a frozen bit, as described above. Using the above example of a lower triangular generating matrix $F^{\otimes n}$, when utilizing known-bit puncturing, the last N-M original bits 1110 of the initial information block 410 corresponding to the punctured bit locations may be set as frozen bits with values of zeros. Upon bit-reversal, the frozen bits may be in different original bit locations 1125, as shown in FIG. 11. The polar encoder 420 may then receive the individual LLR calculations of the remaining unfrozen original bits from the LLR calculation block 1130 and identify the information bits and other frozen bits from the individual LLRs. For example, the polar encoder 420 may identify original bit $u_1$ as an information bit and original bit $u_2$ as a frozen bit. Original bits $u_{N-M} \ldots u_N$ may also remain identified as frozen bits.

Figure 12:
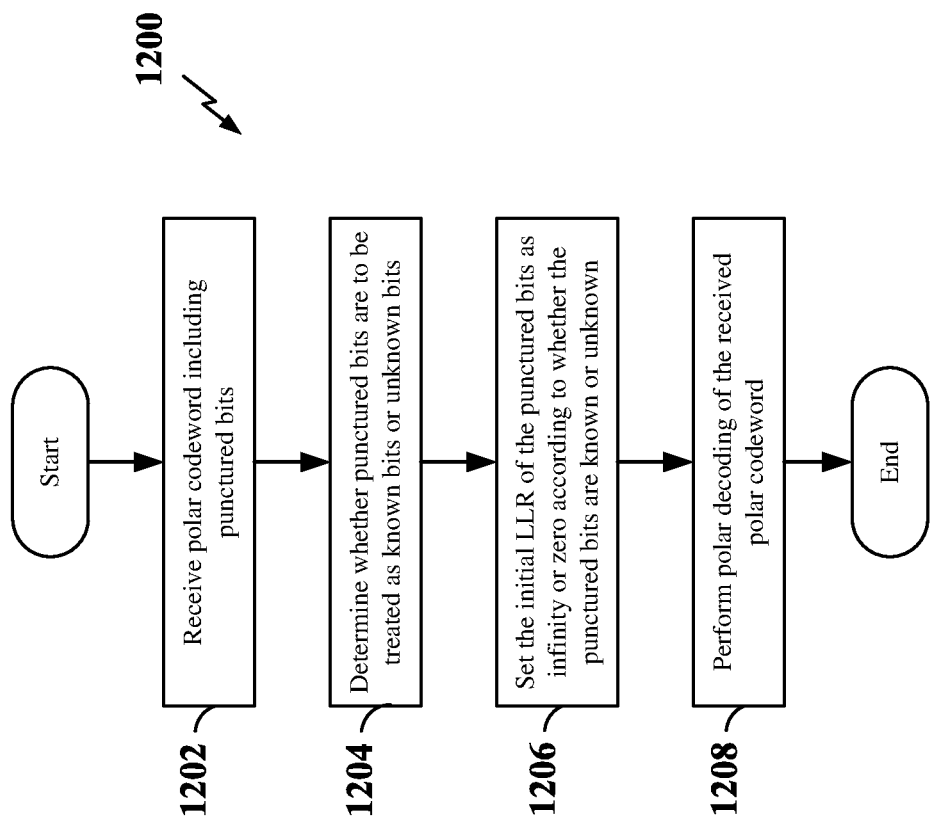
FIG. 12 is a flow chart illustrating an exemplary process for polar decoding according to some embodiments.

Referring now to FIG. 12, a process 1200 is illustrated for polar decoding according to some aspects of the disclosure. In some examples, the process 1200 may be implemented by a wireless communication device as described above and illustrated in FIGS. 1-3. In some examples, the process 1200 may be implemented by any suitable means for carrying out the described functions.

At block 1202, the wireless communication device may receive a polar codeword including one or more punctured bits. In some examples, the wireless communication device may receive a punctured polar codeword, and with knowledge of the puncturing pattern, identify the locations of the punctured bits in the polar codeword. For example, the polar decoder 343 shown and described above in connection with FIG. 3 may receive the polar codeword and determine the locations of the punctured bits.

At block 1204, the wireless communication device may determine whether punctured bits in the received polar codeword are to be treated as known bits or unknown bits. In various aspects of the disclosure, this determination may be explicit or implicit. For example, an explicit transmission may be made from the transmitting device to the receiving device, informing the decoder in the receiving device of which puncturing method is used. Any suitable transmission may be utilized for the explicit indication, e.g., being as simple as a single bit, with one value indicating that the punctured bits are to be treated as known bits, an another value indicating that the punctured bits are to be treated as unknown bits.

In another example, the treatment of the punctured bits may be determined according to a predefined relationship with one or more other coding parameters. That is, in channel coding, information such as the coding rate, the size of the information message, and the size of the codewords may be transmitted to the receiver. According to an aspect of the present disclosure, this information may provide means for the receiver to deduce the puncturing used from the other parameters. As one particular example, the puncturing method may be determined according to the coding rate. That is, in this example, if the coding rate R is greater than a threshold (e.g., ½), then the decoder may deduce that known bit puncturing is used; and if the coding rate R is not greater than the threshold, then the decoder may deduce that unknown bit puncturing is used. For example, the polar decoder 343 shown and described above in connection with FIG. 3 may determine whether the punctured bits are known bits or unknown bits.

At block 1206, the wireless communication device may set the initial LLR of the punctured bits as infinity or zero, according to which puncturing method is used, as determined at block 1204. At block 1208, the wireless communication device may perform polar decoding of the polar codeword. For example, the wireless communication device may perform successive cancellation (SC) decoding, known to those of ordinary skill in the art. Here, an SC decoder calculates the LLR of each coded bit in a recursive manner and obtains the original information block. For example, the polar decoder 343 shown and described above in connection with FIG. 3 may set the initial LLR of the punctured bits and perform polar decoding of the polar codeword.

Figure 13:
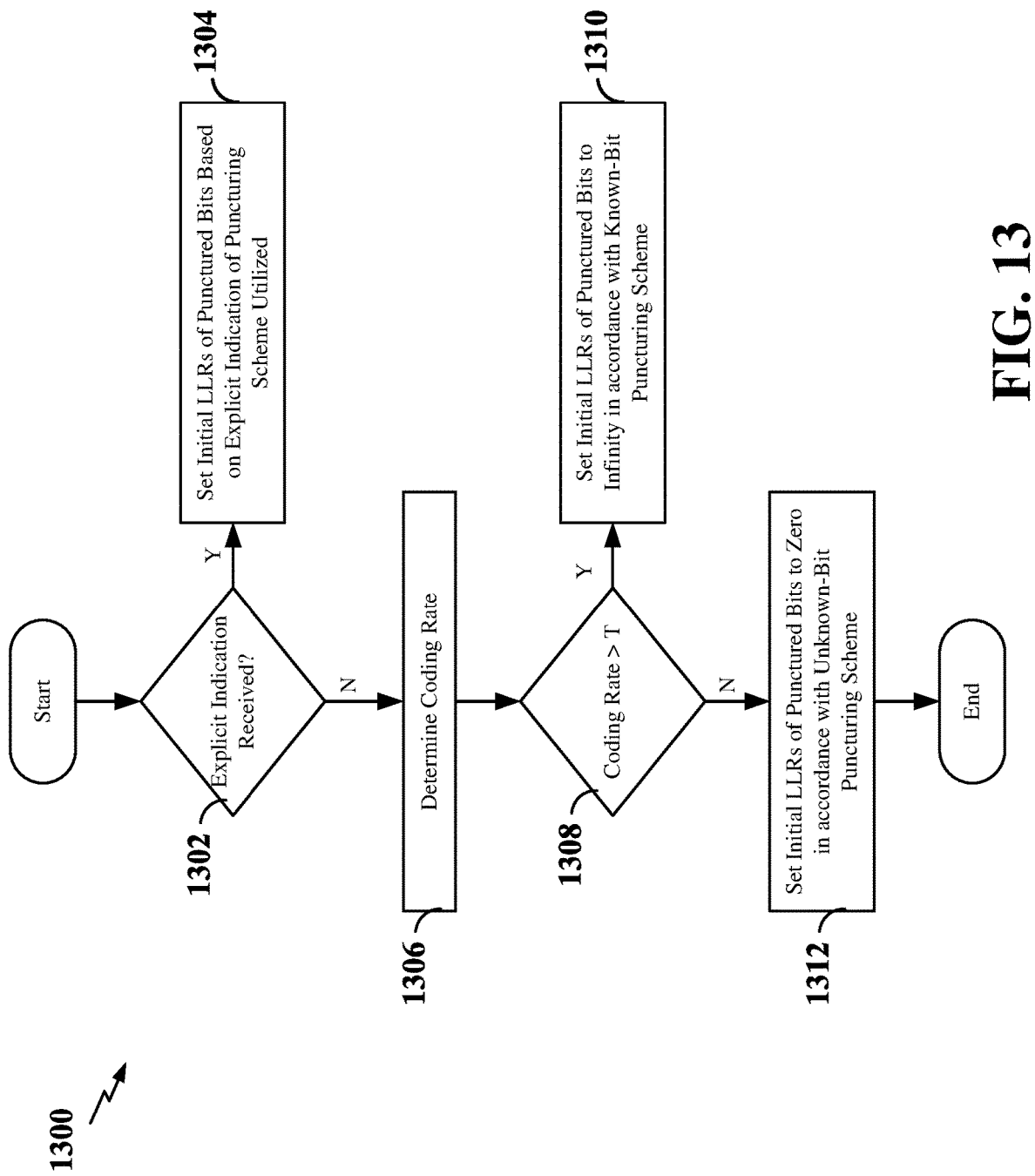
FIG. 13 is a flow chart illustrating an exemplary process for setting the initial LLRs of punctured bits of a received polar codeword according to some embodiments.

FIG. 13 is a flow chart illustrating an exemplary process 1300 for setting the initial LLRs of punctured bits of a received polar codeword according to some aspects of the present disclosure. In some examples, the process 1200 may be implemented by a wireless communication device as described above and illustrated in FIGS. 1-3. In some examples, the process 1200 may be implemented by any suitable means for carrying out the described functions.

At block 1302, the wireless communication device may receive a polar codeword including one or more punctured bits. In some examples, the wireless communication device may receive a punctured polar codeword, and with knowledge of the puncturing pattern, identify the locations of the punctured bits in the polar codeword. For example, the polar decoder 343 shown and described above in connection with FIG. 3 may receive the polar codeword and determine the locations of the punctured bits.

At block 1304, the wireless communication device may determine whether an explicit indication of the puncturing scheme utilized by the transmitter was received. If an explicit indication was received (Y branch of 1304), at block 1306, the wireless communication device may set the initial LLRs of the punctured bits based on the explicit indication. For example, the wireless communication device may set the initial LLRs of the punctured bits to zero if the unknown-bit puncturing scheme was used and to infinity if the known-bit puncturing scheme was used. For example, the polar decoder 343 shown and described above in connection with FIG. 3 may determine whether an explicit instruction was received, and if so, set the initial LLRs of the punctured bits accordingly.

If an explicit instruction was not received (N branch of 1304), at block 1308, the wireless communication device may determine the coding rate used for the polar codeword. At block 1310, the wireless communication device may determine whether the coding rate exceeds a coding rate threshold. In some examples, the coding rate threshold may be ½. For example, the polar decoder 343 shown and described above in connection with FIG. 3 may determine the coding rate and compare the coding rate with a coding rate threshold.

If the coding rate does exceed the coding rate threshold (Y branch of 1308), at block 1310, the wireless communication device may set the initial LLRs of the punctured bits to infinity in accordance with the known-bit puncturing scheme. However, if the coding rate does not exceed the coding rate threshold (N branch of 1308), at block 1312, the wireless communication device may set the initial LLRs of the punctured bits to zero in accordance with the unknown-bit puncturing scheme.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-13 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-3 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of polar coding, comprising:
selecting a puncturing pattern from a first puncturing pattern and a second puncturing pattern, wherein the first puncturing pattern comprises an unknown-bit puncturing scheme in which first punctured bit locations correspond to unknown bits and the second puncturing pattern comprises a known-bit puncturing scheme in which second punctured bit locations correspond to known bits;
polar coding an information block to produce a polar codeword; and
puncturing the polar codeword using the selected puncturing pattern to produce a punctured codeword comprising a codeword length other than a power of two.

2. The method of claim 1, wherein the first puncturing pattern is a bit-reversal permutation of the second puncturing pattern.

3. The method of claim 1, wherein the selecting the selected puncturing pattern from the first puncturing pattern and the second puncturing pattern further comprises:
selecting the puncturing pattern from the first puncturing pattern and the second puncturing pattern based on a coding rate.

4. The method of claim 3, wherein the selecting the puncturing pattern from the first puncturing pattern and the second puncturing pattern based on the coding rate further comprises:
selecting the first puncturing pattern as the puncturing pattern when the coding rate is less than a coding rate threshold; and
selecting the second puncturing pattern as the puncturing pattern when the coding rate is greater than the coding rate threshold.

5. The method of claim 4, wherein the coding rate threshold is ½.

6. The method of claim 1, wherein:
a first reliability of first punctured bits of the polar codeword comprises a first value at a decoder when using the unknown-bit puncturing scheme;
a second reliability of second punctured bits of the polar codeword comprises a second value at the decoder when using the known-bit puncturing scheme, the second value being larger than the first value.

7. The method of claim 1, wherein the selected puncturing pattern comprises a uniform puncturing pattern.

8. The method of claim 1, wherein the selecting the puncturing pattern from the first puncturing pattern and the second puncturing pattern further comprises:
calculating a first log likelihood ratio (LLR) sum for the unknown-bit puncturing scheme;
calculating a second LLR sum for the known-bit puncturing scheme; and
selecting between the unknown-bit puncturing scheme and the known-bit puncturing scheme according to a greater LLR sum between the first LLR sum and the second LLR sum.

9. The method of claim 8, wherein the polar codeword comprises a plurality of coded bit locations, each of the plurality of coded bit locations corresponding to one of a plurality of sub-channels over which the polar codeword is transmitted.

10. The method of claim 9, wherein the calculating the first LLR sum for the unknown-bit puncturing scheme comprises:
setting a respective unknown-bit LLR for each coded bit location of the plurality of coded bit locations corresponding to one of the first punctured bit locations to zero; and
determining respective first coded bit LLRs for remaining ones of the plurality of coded bit locations.

11. The method of claim 10, wherein the information block comprises a plurality of original bit locations, and wherein the calculating the first LLR sum for the unknown-bit puncturing scheme further comprises:
calculating respective first LLRs for the plurality of original bit locations of the information block from the respective first coded bit LLRs and the respective unknown-bit LLRs by performing density evolution or Gaussian approximation; and
calculating the first LLR sum based on the first LLRs.

12. The method of claim 11, wherein the polar codeword comprises an original codeword length of N, and further comprising:
sorting the plurality of sub-channels based on the first LLRs;
selecting K best sub-channels of the plurality of sub-channels in accordance with the first LLRs;
setting first original bits of the information block corresponding to the K best sub-channels as information bits; and
setting second original bits of the information block corresponding to N–K sub-channels as frozen bits.

13. The method of claim 9, wherein the calculating the second LLR sum for the known-bit puncturing scheme comprises:
setting a respective known-bit LLR for each coded bit location of the plurality of coded bit locations corresponding to one of the second punctured bit locations to a value greater than zero; and
determining respective second coded bit LLRs for remaining ones of the coded bit locations.

14. The method of claim 13, wherein the information block comprises a plurality of original bit locations, and wherein calculating the second LLR sum for the known-bit puncturing scheme further comprises:
calculating respective second LLRs for the plurality of original bit locations of the information block from the respective second coded bit LLRs and the respective known-bit LLRs by performing density evolution or Gaussian approximation; and
calculating the second LLR sum based on the second LLRs.

15. The method of claim 14, wherein the polar codeword comprises an original codeword length of N, and the punctured codeword comprises the codeword length of M, and further comprising:
 sorting the plurality of sub-channels based on the second LLRs;
 selecting K best sub-channels of the plurality of sub-channels, excluding the sub-channels corresponding to the second punctured bit locations, in accordance with the second LLRs;
 setting first original bits of the information block corresponding to the K best sub-channels as information bits;
 setting second original bits of the information block corresponding to the sub-channels corresponding to the second punctured bit locations as frozen bits; and
 setting third original bits of the information block corresponding to a remaining number of sub-channels as frozen bits, wherein the remaining number of sub-channels is equal to a difference between N–K and N–M sub-channels.

16. The method of claim 1, wherein the puncturing the polar codeword is performed during the polar coding the information block.

17. The method of claim 1, wherein the polar codeword comprises an original codeword length of N, and the punctured codeword comprises the codeword length of M, and further comprising:
 setting a last N–M original bits of the information block to zero when the selected puncturing pattern comprises the second puncturing pattern.

18. An apparatus configured for polar coding, the apparatus comprising:
 a processor;
 a memory coupled to the processor; and
 a transceiver coupled to the processor,
 wherein the processor and the memory are configured to:
  select a puncturing pattern from a first puncturing pattern and a second puncturing pattern, wherein the first puncturing pattern comprises an unknown-bit puncturing scheme in which first punctured bit locations correspond to unknown bits and the second puncturing pattern comprises a known-bit puncturing scheme in which second punctured bit locations correspond to known bits;
  polar code an information block to produce a polar codeword; and
  puncture the polar codeword using the selected puncturing pattern to produce a punctured codeword comprising a codeword length other than a power of two.

19. The apparatus of claim 18, wherein the first puncturing pattern is a bit-reversal permutation of the second puncturing pattern.

20. The apparatus of claim 18, wherein the processor and the memory are further configured to:
 select the puncturing pattern from the first puncturing pattern and the second puncturing pattern based on a coding rate.

21. The apparatus of claim 20, wherein the processor and the memory are further configured to:
 select the first puncturing pattern as the puncturing pattern when the coding rate is less than a coding rate threshold; and
 select the second puncturing pattern as the puncturing pattern when the coding rate is greater than the coding rate threshold.

22. The apparatus of claim 21, wherein the coding rate threshold is ½.

23. The apparatus of claim 18, wherein:
 a first reliability of first punctured bits of the polar codeword comprises a first value at a decoder when using the unknown-bit puncturing scheme;
 a second reliability of second punctured bits of the polar codeword comprises a second value at the decoder when using the known-bit puncturing scheme, the second value being larger than the first value.

24. The apparatus of claim 18, wherein the selected puncturing pattern comprises a uniform puncturing pattern.

25. The apparatus of claim 18, wherein the puncturing the polar codeword is performed during the polar coding the information block.

26. The apparatus of claim 18, wherein the polar codeword comprises an original codeword length of N, and the punctured codeword comprises the codeword length of M, and wherein the processor and the memory are further configured to:
 set a last N–M original bits of the information block to zero when the selected puncturing pattern comprises the second puncturing pattern.

27. An apparatus configured for polar coding, the apparatus comprising:
 means for selecting a puncturing pattern from a first puncturing pattern and a second puncturing pattern, wherein the first puncturing pattern comprises an unknown-bit puncturing scheme in which first punctured bit locations correspond to unknown bits and the second puncturing pattern comprises a known-bit puncturing scheme in which second punctured bit locations correspond to known bits;
 means for polar coding an information block to produce a polar codeword; and
 means for puncturing the polar codeword using the selected puncturing pattern to produce a punctured codeword comprising a codeword length other than a power of two.

28. The apparatus of claim 27, wherein the first puncturing pattern is a bit-reversal permutation of the second puncturing pattern.

29. The apparatus of claim 27, wherein the means for selecting the puncturing pattern from the first puncturing pattern and the second puncturing pattern further comprises:
 means for selecting the puncturing pattern from the first puncturing pattern and the second puncturing pattern based on a coding rate.

30. The apparatus of claim 29, wherein the means for selecting the puncturing pattern from the first puncturing pattern and the second puncturing pattern based on the coding rate further comprises:
 means for selecting the first puncturing pattern as the puncturing pattern when the coding rate is less than a coding rate threshold; and
 means for selecting the second puncturing pattern as the puncturing pattern when the coding rate is greater than the coding rate threshold.

31. The apparatus of claim 30, wherein the coding rate threshold is ½.

32. The apparatus of claim 27, wherein:
 a first reliability of first punctured bits of the polar codeword comprises a first value at a decoder when using the unknown-bit puncturing scheme;
 a second reliability of second punctured bits of the polar codeword comprises a second value at the decoder when using the known-bit puncturing scheme, the second value being larger than the first value.

33. The apparatus of claim 27, wherein the selected puncturing pattern comprises a uniform puncturing pattern.

34. The apparatus of claim 27, wherein the means for puncturing the polar codeword performs the puncturing during the polar coding of the information block by the means for polar coding.

35. The apparatus of claim 27, wherein the polar codeword comprises an original codeword length of N, and the punctured codeword comprises the codeword length of M, and further comprising:
 means for setting a last N-M original bits of the information block to zero when the selected puncturing pattern comprises the second puncturing pattern.

* * * * *